United States Patent
Tsuchi (10) Patent No.: US 12,445,130 B2
(45) Date of Patent: Oct. 14, 2025

(54) OUTPUT BUFFER CIRCUIT AND SEMICONDUCTOR DEVICE

(71) Applicant: LAPIS Technology Co., Ltd., Yokohama (JP)

(72) Inventor: Hiroshi Tsuchi, Yokohama (JP)

(73) Assignee: LAPIS Technology Co., Ltd., Yokohama (JP)

( * ) Notice: Subject to any disclaimer, the term of this patent is extended or adjusted under 35 U.S.C. 154(b) by 225 days.

(21) Appl. No.: 18/470,368

(22) Filed: Sep. 19, 2023

(65) Prior Publication Data

US 2024/0113712 A1  Apr. 4, 2024

(30) Foreign Application Priority Data

Sep. 29, 2022  (JP) .................................. 2022-156313

(51) Int. Cl.
*H03K 19/003* (2006.01)
*H03K 19/00* (2006.01)
*H03K 19/0185* (2006.01)

(52) U.S. Cl.
CPC ... *H03K 19/00315* (2013.01); *H03K 19/0013* (2013.01); *H03K 19/018521* (2013.01)

(58) Field of Classification Search
CPC ......... H03K 19/0013; H03K 19/00315; H03K 19/0175; H03K 19/017509; H03K 19/0185; H03K 19/018507; H03K 19/018521
See application file for complete search history.

(56) References Cited

U.S. PATENT DOCUMENTS

| | | | | |
|---|---|---|---|---|
| 5,430,335 A | * | 7/1995 | Tanoi | H03K 19/09429 327/170 |
| 5,469,385 A | * | 11/1995 | Smith | G11C 7/1057 365/189.11 |
| 5,872,473 A | * | 2/1999 | Williams | H03K 19/018571 327/108 |
| 6,072,351 A | * | 6/2000 | Sharpe-Geisler | H03K 19/00315 327/112 |
| 6,097,237 A | * | 8/2000 | Singh | H03K 19/00315 326/27 |

(Continued)

FOREIGN PATENT DOCUMENTS

JP  H06152374  5/1994

*Primary Examiner* — Jason M Crawford
(74) *Attorney, Agent, or Firm* — JCIPRNET (57) ABSTRACT

The disclosure includes: a bias circuit generating first and second bias voltages; a first conductivity type first transistor supplying a first power source voltage to a first node according to the input signal; a second conductivity type second transistor supplying a second power source voltage to a second node according to the input signal; a second conductivity type third transistor receiving the first bias voltage by gate, with source and drain connected to the second and first nodes; a first conductivity type fourth transistor receiving the second bias voltage by gate, with source and drain connected to the first and second nodes; a first conductivity type fifth transistor supplying the first power source voltage to an output terminal according to voltage at the first node; and a second conductivity type sixth transistor supplying the second power source voltage to the output terminal according to voltage at the second node.

8 Claims, 4 Drawing Sheets

(56) References Cited

U.S. PATENT DOCUMENTS

| | | | | |
|---|---|---|---|---|
| 6,236,239 | B1* | 5/2001 | Kogushi | G06F 13/4072 |
| | | | | 326/88 |
| 7,292,073 | B2* | 11/2007 | Khan | H03K 19/00315 |
| | | | | 327/170 |
| 2012/0318958 | A1* | 12/2012 | Hagihara | H04N 25/78 |
| | | | | 327/291 |
| 2014/0292379 | A1* | 10/2014 | Itonaga | H03K 19/00 |
| | | | | 327/109 |
| 2014/0333370 | A1* | 11/2014 | Itonaga | G05F 1/10 |
| | | | | 327/541 |
| 2019/0147825 | A1* | 5/2019 | Tsuchi | H03F 3/4521 |
| | | | | 345/209 |
| 2022/0085805 | A1* | 3/2022 | Sawahara | H03K 17/687 |
| 2024/0113712 | A1* | 4/2024 | Tsuchi | H03K 19/00315 |
| 2024/0144853 | A1* | 5/2024 | Tsuchi | H03K 19/018521 |
| 2024/0321169 | A1* | 9/2024 | Tsuchi | G09G 3/2092 |

* cited by examiner

OUTPUT BUFFER CIRCUIT AND SEMICONDUCTOR DEVICE

CROSS-REFERENCE TO RELATED APPLICATION

This application claims priority under 35 USC 119 from Japanese Patent application No. 2022-156313 filed on Sep. 29, 2022, the disclosure of which is incorporated by reference herein.

BACKGROUND

Technical Field

The disclosure relates to an output buffer circuit and a semiconductor device for driving loads.

Description of Related Art

Some semiconductor integrated circuits are provided with an output buffer that drives a capacitive load such as an externally connected signal line with a pulse signal.

The output buffer includes a P-channel MOS (metal oxide semiconductor) type transistor and an N-channel MOS type transistor which receive, for example, a binary (logic level 0 or 1) input signal at the respective gate terminals and whose drain terminals are connected to an output node. The output buffer outputs a driving signal for driving a capacitive load from the output node by setting the above-mentioned two transistors to an ON state complementarily by the binary input signal.

Meanwhile, for an output buffer driving 2 power source voltages with a relatively large voltage difference, compared to the timing at which one of the two transistors switches from an OFF state to the ON state, the timing at which the other transistor switches from the ON state to the OFF state may be delayed. At this time, the two transistors are temporarily turned ON at the same time, and a through current flows therebetween.

In particular, high-output type output buffers that drive loads having relatively large load capacities often face the problem of consuming significantly more power and generating power supply noise due to their larger transistor sizes.

Thus, in order to solve this problem, an output buffer circuit has been proposed, in which a pre-buffer part is provided in the front stage of the buffer part composed of the above-mentioned P-channel MOS transistor and N-channel MOS transistor (see Patent Document 1 (Japanese Patent Application Laid-Open (JP-A) No. 6-152374)).

The pre-buffer part included in the output buffer circuit recited in Patent Document 1 includes a first inverter that receives an input signal and supplies the inverted signal thereof to the gate of the above-mentioned P-channel MOS transistor, and a second inverter that receives the input signal and supplies the inverted signal thereof to the gate of the N-channel MOS transistor. At this time, a current source is connected to the source of the N-channel MOS transistor of the first inverter, and a current source is connected to the source of the P-channel MOS transistor of the second inverter. In the output buffer circuit recited in Patent Document 1, the transition from the ON state to the OFF state of the two transistors in the buffer part is made slower than the transition from the OFF state to the ON state by controlling the current flowing through each current source in the pre-buffer part. As a result, the output buffer circuit avoids a state in which the two transistors of the buffer part are in the ON state at the same time, thereby preventing a through current.

However, the first and second inverters included in the pre-buffer part recited in Patent Document 1 may experience a through current flow associated with the current generated by the above-mentioned current source when the logic level of the input signal changes.

Hence, especially high-driving-capacity output buffers have the problem that they cannot suppress the increase in power consumption and the generation of power supply noise due to their larger transistor sizes.

The disclosure provides an output buffer circuit and a semiconductor device capable of suppressing the increase in circuit area, reducing power consumption associated with through current, suppressing noise generation, and achieving high-speed response.

SUMMARY

The output buffer circuit according to the disclosure is an output buffer circuit outputting an output signal obtained by amplifying an input signal from an output terminal and including: a bias circuit, generating a first bias voltage and a second bias voltage; a first conductivity type first transistor, receiving the input signal by a gate and supplying a first power source voltage to a first node in response to the ON state according to the input signal; a second conductivity type second transistor, receiving the input signal by a gate and supplying a second power source voltage to a second node in response to the ON state according to the input signal; a second conductivity type third transistor, receiving the first bias voltage by a gate, with a source connected to the second node and a drain connected to the first node; a first conductivity type fourth transistor, receiving the second bias voltage by a gate, with a source connected to the first node and a drain connected to the second node; a first conductivity type fifth transistor, receiving a voltage at the first node by a gate and supplying the first power source voltage to the output terminal in response to the ON state according to the voltage at the first node; and a second conductivity type sixth transistor, receiving a voltage at the second node by a gate and supplying the second power source voltage to the output terminal in response to the ON state according to the voltage at the second node.

The semiconductor device according to the disclosure is a semiconductor device including an output buffer circuit, which outputs an output signal obtained by amplifying an input signal from an output terminal. The output buffer circuit includes a bias circuit, generating a first bias voltage and a second bias voltage; a first conductivity type first transistor, receiving the input signal by a gate and supplying a first power source voltage to a first node in response to the ON state according to the input signal; a second conductivity type second transistor, receiving the input signal by a gate and supplying a second power source voltage to a second node in response to the ON state according to the input signal; a second conductivity type third transistor, receiving the first bias voltage by a gate, with a source connected to the second node and a drain connected to the first node; a first conductivity type fourth transistor, receiving the second bias voltage by a gate, with a source connected to the first node and a drain connected to the second node; a first conductivity type fifth transistor, receiving a voltage at the first node by a gate and supplying the first power source voltage to the output terminal in response to the ON state according to the voltage at the first node; and a second conductivity type sixth transistor, receiving a voltage at the second node by a gate and supplying the second power source voltage to the output terminal in response to the ON state according to the voltage at the second node.

Further, the semiconductor device according to the disclosure is a semiconductor device including first to k-th (k is an integer of 2 or more) output buffer circuits, which separately receive first to k-th input signals and output output signals obtained by amplifying the received input signal from output terminals of the first to the k-th output buffer circuits, and including a bias circuit, generating a first bias voltage and a second bias voltage. Each of the first to the k-th output buffer circuit includes: a first conductivity type first transistor, receiving the received input signal by a gate and supplying a first power source voltage to a first node in response to the ON state according to the input signal; a second conductivity type second transistor, receiving the received input signal by a gate and supplying a second power source voltage to a second node in response to the ON state according to the input signal; a second conductivity type third transistor, receiving the first bias voltage by a gate, with a source connected to the second node and a drain connected to the first node; a first conductivity type fourth transistor, receiving the second bias voltage by a gate, with a source connected to the first node and a drain connected to the second node; a first conductivity type fifth transistor, receiving a voltage at the first node by a gate and supplying the first power source voltage to the output terminal in response to the ON state according to the voltage at the first node; and a second conductivity type sixth transistor, receiving a voltage at the second node by a gate and supplying the second power source voltage to the output terminal in response to the ON state according to the voltage at the second node.

DESCRIPTION OF THE EMBODIMENTS

In the output buffer circuit according to the disclosure, when transitioning a pair of transistors in the output stage from the ON state to the OFF state, a transistor with high current driving capability controls the gate voltage of the pair of transistors in the output stage. On the other hand, when transitioning from the OFF state to the ON state, a transistor with reduced current driving capability controls the gate voltage.

With such a configuration, through current flowing between the pair of transistors in the output stage is suppressed by a relatively small-scale circuit configuration, making it possible to suppress the increase in power consumption and the noise generation associated with the through current.

Furthermore, in the output buffer circuit according to the disclosure, since the input signal receives only the gate capacity of each of the two transistors, a high-speed response is achieved.

Embodiment 1

Figure 1:
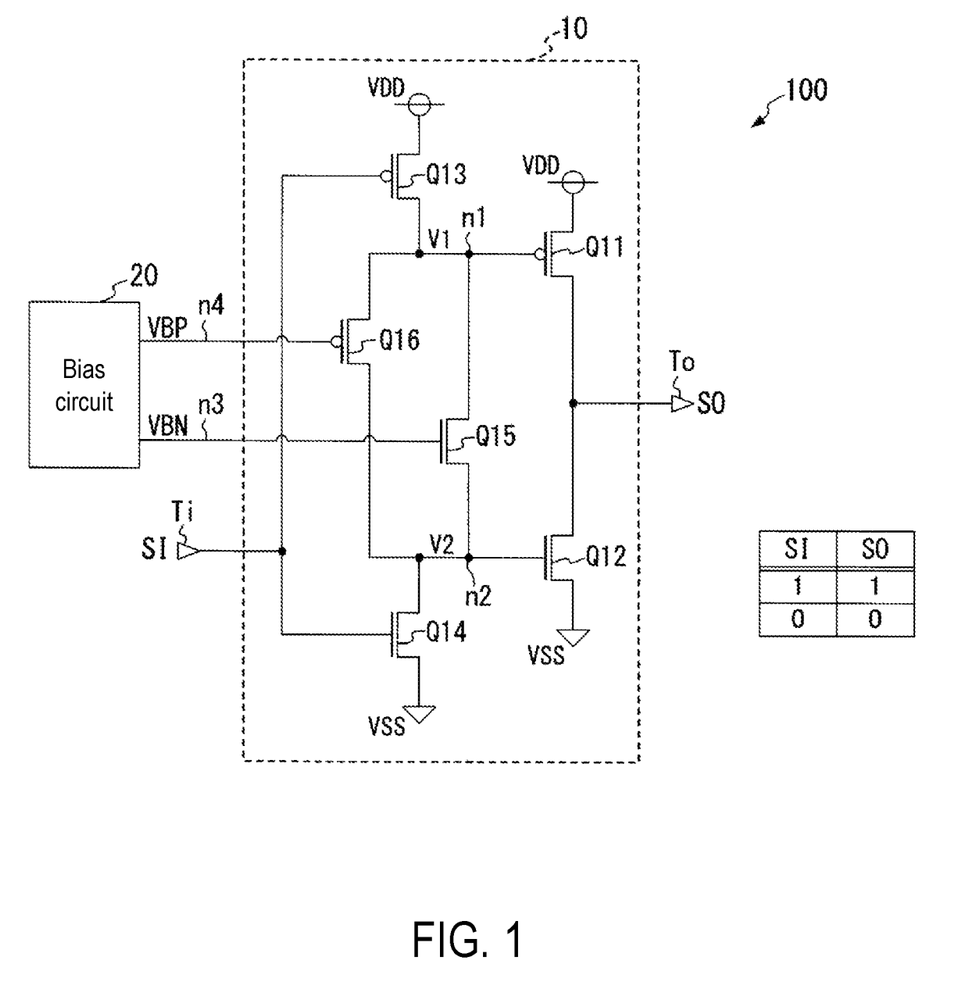
FIG. 1 is a circuit diagram illustrating the configuration of the output buffer circuit 100 according to the disclosure.

FIG. 1 is a circuit diagram illustrating the configuration of the output buffer circuit 100 according to the disclosure.

The output buffer circuit 100 is a so-called non-inverting buffer that outputs an output signal SO, which is obtained by amplifying a binary (logic level 0 or 1) input signal SI received by an input terminal Ti, through an output terminal To. In the input signal SI, the actual signal level of logic level 1 is, for example, the power source voltage VDD, and the signal level of logic level 0 is, for example, the grounding voltage VSS.

The output buffer circuit 100 is, for example, defined in a semiconductor IC chip as a semiconductor device and has a buffer part 10 and a bias circuit 20.

The buffer part 10 includes an output stage including a P-channel type transistor Q11 and an N-channel type transistor Q12 and a pre-buffer stage including N-channel type transistors Q14, Q15 and P-channel type transistors Q13 and Q16.

In the buffer part 10, the input terminal Ti is connected to the gate of each of the transistors Q13 and Q14. The power source voltage VDD is applied to the source of the transistor Q13, and the drain thereof is connected to the source of transistor Q16 and the drain of the transistor Q15 through a node n1. The grounding voltage VSS is applied to the source of the transistor Q14, and the drain thereof is connected to the drain of the transistor Q16 and the source of the transistor Q15 through a node n2.

The power source voltage VDD is applied to the source of the transistor Q11, and the grounding voltage VSS is applied to the source of the transistor Q12. The drain of each of the transistors Q11 and Q12 is connected to the output terminal To, and the signal having the voltage generated at the output terminal To is output as the output signal SO.

The bias circuit 20 generates a bias voltage VBN with a predetermined first voltage value and supplies the same to the gate of the transistor Q15 through a node n3. In addition, the bias circuit 20 generates a bias voltage VBP with a predetermined second voltage value and supplies the same to the gate of the transistor Q16 through a node n4.

The bias voltage VBN is lower than the power source voltage VDD and has a voltage value so that the gate-source voltage of the transistor Q15 exceeds the threshold voltage Vth when the voltage (V2) at the node n2 becomes the grounding voltage VSS. Moreover, the bias voltage VBP is higher than the grounding voltage VSS and has a voltage value so that the gate-source voltage of the transistor Q16 exceeds the threshold voltage Vth when the voltage (V1) at the node n1 becomes the power source voltage VDD.

Next, the internal operation of the output buffer circuit 100 is described.

Figure 2:
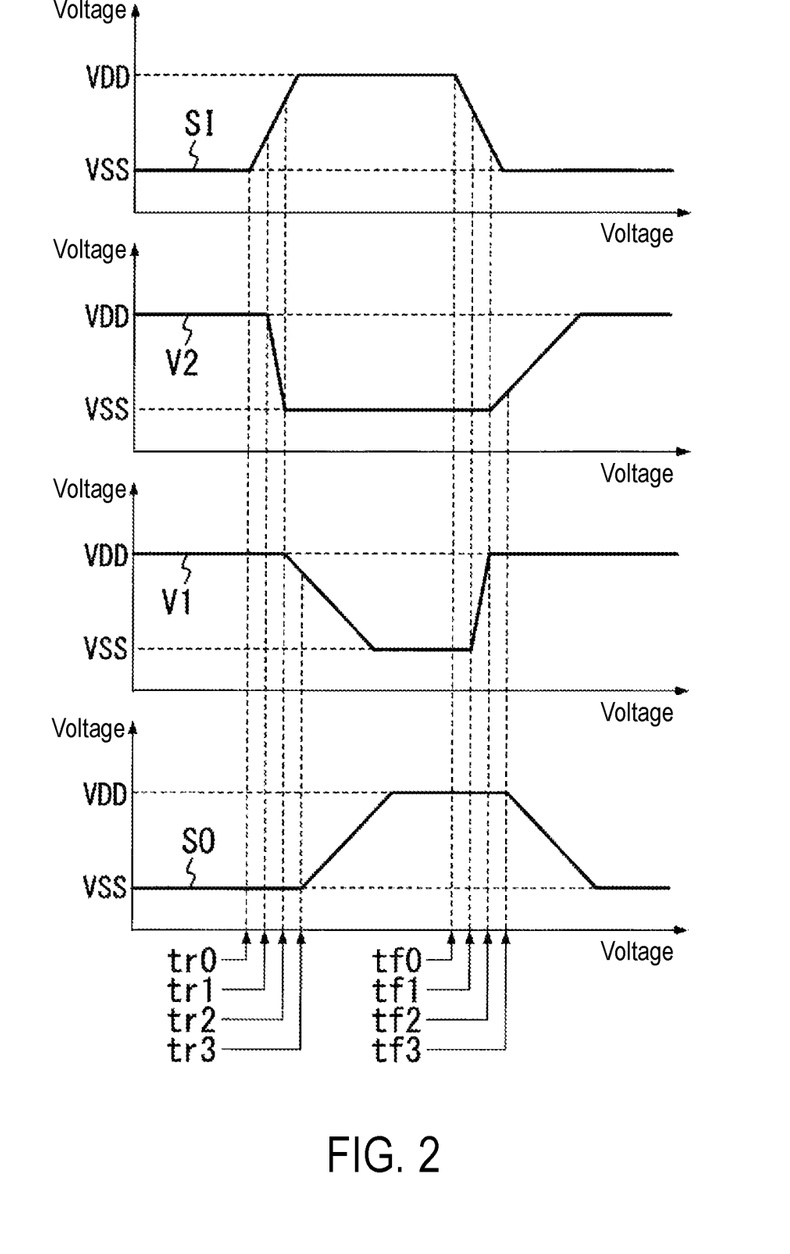
FIG. 2 is a time chart illustrating the internal operation of the output buffer circuit 100.

FIG. 2 is a time chart illustrating the internal operation of the output buffer circuit 100 when it receives the input signal SI that transitions from logic level 0 (grounding voltage VSS) to logic level 1 (power source voltage VDD) and then returns to logic level 0 again.

First, when the input signal SI is in the logic level 0 (VSS) state, the transistor Q13 is turned ON to supply the power source voltage VDD to the node n1. As a result, since the gate-source voltage of the transistor Q11 becomes less than the threshold voltage Vth, the transistor Q11 is turned OFF. Also, the transistor Q14 is turned OFF and the node n2 is cut off from the grounding voltage VSS. As a result, the voltage V1 at the node n1 becomes the power source voltage VDD, the gate-source voltage of the transistor Q16 exceeds the threshold voltage Vth, and the transistor 16 is turned ON.

Thus, the voltage V1 (VDD) at the node n1 is supplied to the node n2 through the transistor Q16, and the voltage V2 at the node n2 becomes the power source voltage VDD. As a result, since the gate-source voltage of the transistor Q12 exceeds the threshold voltage Vth, the transistor Q12 is turned ON, and the output signal SO at logic level 0 (VSS) is output from the output terminal To. Moreover, the transistor Q15 is turned OFF when the voltage V2 at the node n2 increases, causing the gate-source voltage to become less than the threshold voltage Vth.

After that, at time point tr0 as shown in FIG. 2, the voltage of the input signal SI starts to increase. At time point tr1, when the threshold voltage Vth of the transistor Q14 is exceeded, the transistor Q14 is turned ON and the ground voltage VSS is supplied to the node n2. As a result, the current driving capability of the transistor Q14 increases, while the current driving capability of the transistor Q13 decreases, and the transistor Q13 transitions to the OFF state. At this time, since the current driving capability of the transistor Q14 is higher than the current driving capability of the transistor Q16, the voltage V2 at the node n2 relatively rapidly decreases from the state of the power source voltage VDD after time point tr1 and reaches the grounding voltage VSS at time point tr2, as shown in FIG. 2. As a result, since the gate-source voltage of the transistor Q12 becomes less than the threshold voltage Vth, the transistor Q11 is turned OFF. Thereby, the gate-source voltage of the transistor Q15 exceeds the threshold voltage Vth, and the transistor Q15 is turned ON. As a result, the transistor Q15 supplies the voltage V2 (VSS) at the node n2 to the node n1 with the current driving capability corresponding to the bias voltage VBN, causing the voltage V1 at the node n1 to gradually decrease as shown in FIG. 2. This also causes the gate-source voltage of the transistor Q16 to fall below the threshold voltage Vth, and the transistor Q16 transitions to the OFF state.

At time point tr3 shown in FIG. 2, when the gate-source voltage of the transistor Q11 exceeds the threshold voltage Vth, the transistor Q11 is turned ON and the power source voltage VDD is supplied to the output terminal To. As a result, as shown in FIG. 2, the voltage of the output signal SO gradually increases at the same speed as the speed of change of the voltage V1 and transitions from the logic level 0 (VSS) state to the logic level 1 state.

Afterwards, at time point tf0 shown in FIG. 2, the input signal SI starts to decrease, and at time point tf1, when the threshold voltage Vth of the transistor Q13 is exceeded, the transistor Q13 is turned ON, and the power source voltage VDD is supplied to the node n1. As a result, the current driving capability of the transistor Q13 increases, while the current driving capability of the transistor Q14 decreases and transitions to the OFF state. At this time, since the current driving capability of the transistor Q13 is higher than the current driving capability of the transistor Q15, the voltage V1 at the node n1 relatively rapidly increases from the state of the grounding voltage VSS after time point to and reaches the power source voltage VDD at time point tf2, as shown in FIG. 2. As a result, since the gate-source voltage of the transistor Q11 becomes less than the threshold voltage Vth, the transistor Q11 is turned OFF. Thereby, the gate-source voltage of the transistor Q16 exceeds the threshold voltage Vth, and the transistor Q16 is turned ON. As a result, the transistor Q16 supplies the voltage V1 (VDD) at the node n1 to the node n2 with the current driving capability corresponding to the bias voltage VBP, causing the voltage V2 at the node n2 to gradually increase as shown in FIG. 2. This also causes the gate-source voltage of the transistor Q15 to fall below the threshold voltage Vth, and the transistor Q15 transitions to the OFF state.

At time point tf3 shown in FIG. 2, when the gate-source voltage of the transistor Q12 exceeds the threshold voltage Vth, the transistor Q12 is turned ON and the grounding voltage VSS is supplied to the output terminal To. As a result, as shown in FIG. 2, the voltage of the output signal SO gradually decrease at the same speed as the speed of change of the voltage V2 and transitions from the logic level 1 (VDD) state to the logic level 0 state.

As described above, in the output buffer circuit 100, when transitioning the pair of transistors (Q11, Q12) in the output stage from the ON state to the OFF state, the transistors (Q13, Q14) with high current driving capability control the gate voltage (V1, V2) of the pair of transistors. On the other hand, when transitioning the pair of transistors (Q11, Q12) from the ON state to the OFF state, in the output buffer circuit 100, the gate voltages (V1, V2) of the pair of transistors are controlled by the transistors (Q15, Q16) whose current driving capability are lowered by the bias voltages (VBN, VBP).

As a result, after one transistor Q11 (Q12) in the output stage transitions to the OFF state in response to the input signal SI, the other transistor Q12 (Q11) transitions to the ON state, thereby avoiding the simultaneous ON state of both of the transistors and suppressing the through current.

Here, according to the circuit configuration shown in FIG. 1, at time point tf2 immediately before the transistor Q14 transitions to the OFF state, when the voltages V1 and V2 become the power source voltage VDD and the grounding voltage VSS, respectively, there is a possibility that the through current flows between the nodes n1 and n2 through the transistors Q15 and Q16. However, when the node n1 transitions from the power source voltage VDD to the grounding voltage VSS, the transistor Q16 turns OFF immediately after the transition starts. Moreover, when the node n2 transitions from the grounding voltage VSS to the power source voltage VDD, the transistor Q15 turns OFF immediately after the transition starts. As a result, one of the transistors Q15 and Q16 is substantially OFF. Furthermore, the periods during which the voltages V1 and V2 become the power source voltage VDD and the grounding voltage VSS are extremely short, so the through current flowing between the nodes n1 and n2 is also very small.

Thus, the output buffer circuit 100 is more capable of reducing the through current compared to the output buffer circuit recited in Patent Document 1, thereby decreasing power consumption and ensuring effective suppression of noise generation.

Moreover, in the output buffer circuit 100, the only load connected to the input terminal Ti is the gate of each of the two transistors Q13 and Q14. Thus, compared to the output buffer circuit recited in Patent Document 1, which has input terminals connected to the gates of four transistors, the output buffer circuit in the disclosure is capable of reducing the input capacitance and thereby enabling high-speed response.

In short, the output buffer circuit 100 utilizes a relatively small-scale circuit configuration, including the bias circuit (20) that generates the first and second bias voltages (VBN, VBP) and the following first to sixth transistors (Q11 to Q16), to achieve high-speed response while suppressing the increase in power consumption and the noise generation associated with the through current.

That is, the first conductivity type first transistor (Q13) receives the input signal (SI) by the gate and supplies the first power source voltage (VDD) to the first node (n1) in response to the ON state according to the input signal. The second conductivity type second transistor (Q14) receives the input signal (SI) by the gate and supplies the second power source voltage (VSS) to the second node (n2) in response to the ON state according to the input signal. The second conductivity type third transistor (Q15) receives the first bias voltage (VBN) by the gate and has the source connected to the second node and the drain connected to the first node. The first conductivity type fourth transistor (Q16) receives the second bias voltage (VBP) by the gate and has the source connected to the first node and the drain connected to the second node. The first conductivity type fifth transistor (Q11) receives the voltage at the first node by the gate and supplies the first power source voltage (VDD) to the output terminal (To) in response to the ON state according to the voltage at the first node. The second conductivity type sixth transistor (Q12) receives the voltage at the second node by the gate and supplies the second power source voltage (VSS) to the output terminal (To) in response to the ON state according to the voltage at the second node.

Embodiment 2

Figure 3:
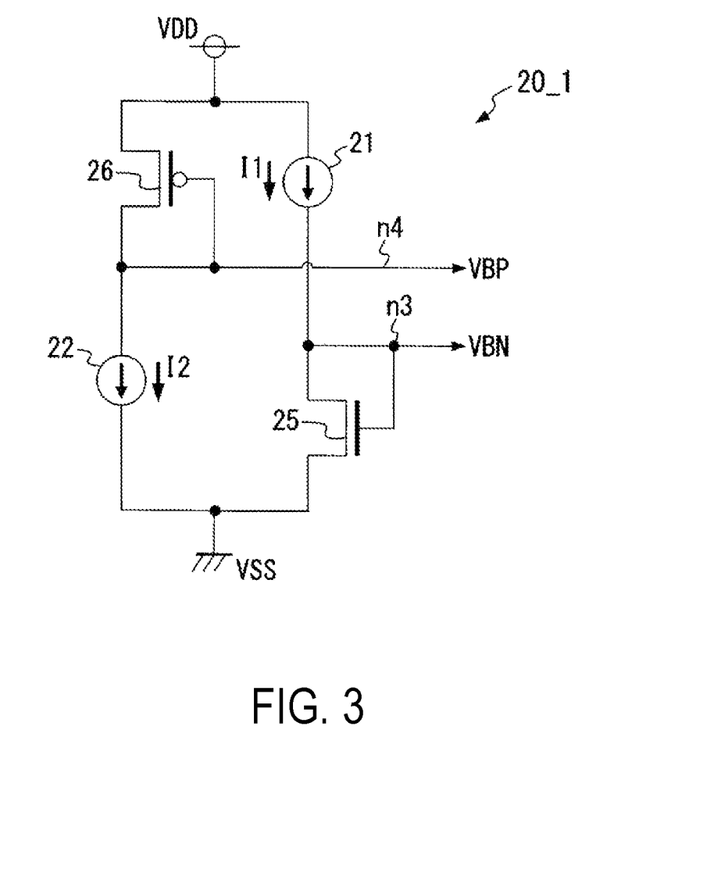
FIG. 3 is a circuit diagram illustrating the configuration of the bias circuit 20_1 as an example of the bias circuit 20.

FIG. 3 is a circuit diagram illustrating the configuration of the bias circuit 20_1 as an example of the bias circuit 20.

As shown in FIG. 3, the bias circuit 20_1 includes current sources 21 and 22, and an N-channel type transistor 25 and a P-channel type transistor 26 as current-voltage converters, respectively.

The current source 21 generates a constant current I1 with a constant current value based on the power source voltage VDD and transmits the same to the node n3. The transistor 25 is a so-called diode-connected transistor whose drain and gate are connected to the node n3 and whose source is applied with the grounding voltage VSS.

The transistor 26 is a so-called diode-connected transistor whose drain and gate are connected to the node n4 and whose source is applied with the power source voltage VDD. The current source 22 generates a constant current I2 with a constant current value based on the voltage at the node n4 and feeds the same from the node n4 to the ground terminal to which the grounding voltage VSS is applied.

With such a configuration, in the bias circuit 20_1 shown in FIG. 3, the constant current I1 generated by the current source 21 undergoes current-voltage conversion by the diode-connected transistor 25. At this time, the voltage generated at the node n3 is output as the bias voltage VBN.

Further, in the bias circuit 20_1, the constant current I2 generated by the current source 22 undergoes current-voltage conversion by the diode-connected transistor 26. At this time, the voltage generated at the node n4 is output as the bias voltage VBP.

Meanwhile, when the input signal SI transitions from logic level 0 (VSS) to logic level 1 (VDD), causing the voltage V2 at the node n2 to change to the grounding voltage VSS, the bias voltage VBN acts on the buffer part 10 as shown in FIG. 1. At this time, the transistor 25 of the bias circuit 20_1 and the transistor Q15 of the buffer part 10 form a current mirror, and the constant current I1 flowing through the transistor 25 is copied as the current flowing through the transistor Q15.

Similarly, when the input signal SI transitions from logic level 1 (VDD) to logic level 0 (VSS), causing the voltage V1 at the node n1 to change to the power source voltage VDD, the bias voltage VBP acts on the buffer part 10 as shown in FIG. 1. At this time, the transistor 26 of the bias circuit 20_1 and the transistor Q16 of the buffer part 10 form a current mirror, and the constant current I2 flowing through the transistor 26 is copied as the current flowing through the transistor Q16.

The current mirror ratio in the current mirror is allowed to be adjusted to a particular current mirror ratio by adjusting the sizes (gate width, gate length) of the transistors Q15 and 25 (Q16 and 26) and the number of transistors connected in parallel.

Moreover, in the bias circuit 20_1, a configuration is adopted where the supply of the grounding voltage VSS (power source voltage VDD) to the source of the diode-connected transistor 25 (26) is performed through a load element, thereby increasing the current flowing through the transistor Q15 (Q16). Further, the load element may, for example, have a configuration in which one or more transistors are stacked vertically.

Embodiment 3

Figure 4:
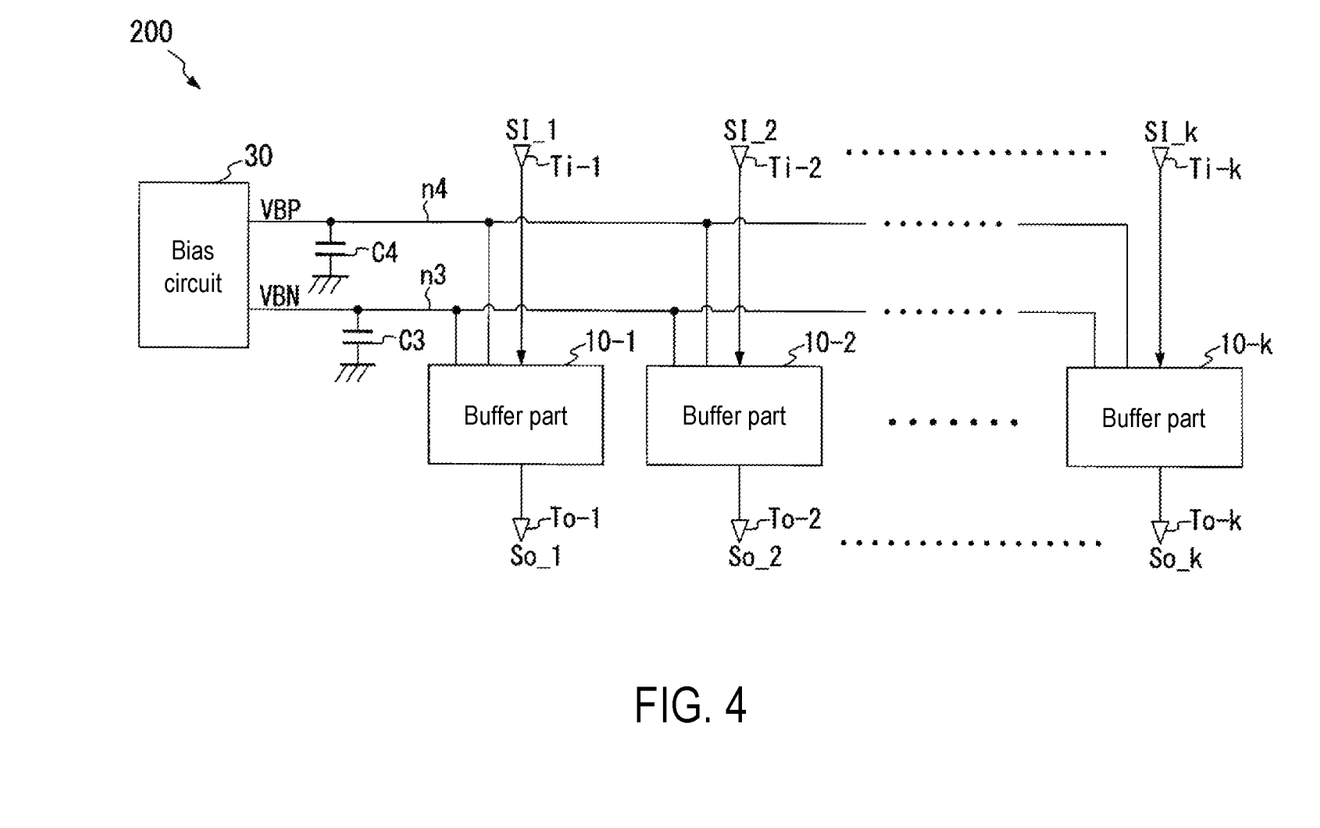
FIG. 4 is a block diagram illustrating the configuration of the output device 200 having k output channels.

FIG. 4 is a block diagram illustrating the configuration of the output device 200 having k (k is an integer of 2 or more) output channels.

The output device 200 receives multiple input signals SI_1 to SI_k at the input terminals Ti_1 to Ti_k and outputs output signals SO_1 to SO_k, which are respectively amplified, through the output terminals To_1 to To_k.

As shown in FIG. 4, the output device 200 includes buffer parts 10_1 to 10_k, each having the same configuration as the buffer part 10 shown in FIG. 1, and a bias circuit 30 having the same configuration as the bias circuit 20_1 shown in FIG. 3.

The bias circuit 30 generates the bias voltage VBN and supplies the same to the gate of the transistor Q15 of each of the buffer parts 10_1 to 10_k through the node n3. Further, the bias circuit 30 generates the bias voltage VBP and supplies the same to the gate of the transistor Q16 of each of the buffer parts 10_1 to 10_k through the node n4.

The node n3 is connected to one end of a condenser C3 for suppressing and stabilizing the variations of the bias voltage VBN. Moreover, the node n4 is connected to one end of a condenser C4 for suppressing and stabilizing the variations of the bias voltage VBP.

In this way, in the output device 200, it is necessary to have k buffer parts 10_1 to 10_k, each having the same configuration as the buffer part 10 shown in FIG. 1, for the k output channels. However, the number of the bias circuit 30 is 1, regardless of the number of the output channels. Thus, it is possible to reduce the circuit scale of the entire device compared to the case where k output buffer circuits recited in Patent Document 1 are provided in order to realize k output channels.

What is claimed is:

1. An output buffer circuit, outputting an output signal obtained by amplifying an input signal from an output terminal, comprising:

a bias circuit, generating a first bias voltage and a second bias voltage;

a first conductivity type first transistor, receiving the input signal by a gate and supplying a first power source voltage to a first node in response to an ON state according to the input signal;

a second conductivity type second transistor, receiving the input signal by a gate and supplying a second power source voltage to a second node in response to the ON state according to the input signal;

a second conductivity type third transistor, receiving the first bias voltage by a gate, with a source connected to the second node and a drain connected to the first node;

a first conductivity type fourth transistor, receiving the second bias voltage by a gate, with a source connected to the first node and a drain connected to the second node;

a first conductivity type fifth transistor, receiving a voltage at the first node by a gate and supplying the first power source voltage to the output terminal in response to the ON state according to the voltage at the first node; and a second conductivity type sixth transistor, receiving a voltage at the second node by a gate and supplying the second power source voltage to the output terminal in response to the ON state according to the voltage at the second node.

2. The output buffer circuit according to claim 1, wherein a current driving capability of each of the third transistor and the fourth transistor is lower than a current driving capability of each of the first transistor and the second transistor.

3. The output buffer circuit according to claim 2, wherein the first bias voltage is lower than the first power source voltage and has a voltage value so that a gate-source voltage of the third transistor exceeds a threshold voltage of the third transistor in response to the voltage at the second node becoming the second power source voltage, and the second bias voltage is higher than the second power source voltage and has a voltage value so that a gate-source voltage of the fourth transistor exceeds the threshold voltage in response to the voltage at the first node becoming the first power source voltage.

4. The output buffer circuit according to claim 1, wherein the bias circuit comprises:

a first current source, generating a first constant current;

a first current-voltage converter, outputting a voltage obtained by performing a current-voltage conversion on the first constant current as the first bias voltage;

a second current source, generating a second constant current; and a second current-voltage converter, outputting a voltage obtained by performing the current-voltage conversion on the second constant current as the second bias voltage.

5. The output buffer circuit according to claim 4, wherein the first current-voltage converter comprises a second conductivity type seventh transistor, which receives the first constant current through a third node by a gate and a drain and to which the second power source voltage is applied at a source, the second current-voltage converter comprises a first conductivity type eighth transistor, which receives the second constant current through a fourth node by a gate and a drain and to which the first power source voltage is applied at a source, and a voltage at the third node is output as the first bias voltage and a voltage at the fourth node is output as the second bias voltage.

6. The output buffer circuit according to claim 5, wherein the first current-voltage converter receives the first constant current through the third node by the gate and the drain of the seventh transistor and applies the second power source voltage at the source of the seventh transistor through a first load element, and the second current-voltage converter receives the second constant current through the fourth node by the gate and the drain of the eighth transistor and applies the first power source voltage at the source of the eighth transistor through a second load element.

7. A semiconductor device comprising an output buffer circuit, which outputs an output signal obtained by amplifying an input signal from an output terminal, wherein the output buffer circuit comprises:

a bias circuit, generating a first bias voltage and a second bias voltage;

a first conductivity type first transistor, receiving the input signal by a gate and supplying a first power source voltage to a first node in response to an ON state according to the input signal;

a second conductivity type second transistor, receiving the input signal by a gate and supplying a second power source voltage to a second node in response to the ON state according to the input signal;

a second conductivity type third transistor, receiving the first bias voltage by a gate, with a source connected to the second node and a drain connected to the first node;

a first conductivity type fourth transistor, receiving the second bias voltage by a gate, with a source connected to the first node and a drain connected to the second node;

a first conductivity type fifth transistor, receiving a voltage at the first node by a gate and supplying the first power source voltage to the output terminal in response to the ON state according to the voltage at the first node; and a second conductivity type sixth transistor, receiving a voltage at the second node by a gate and supplying the second power source voltage to the output terminal in response to the ON state according to the voltage at the second node.

8. A semiconductor device comprising first to k-th (k is an integer of 2 or more) output buffer circuits, which separately receive first to k-th input signals and output output signals obtained by amplifying the received input signals from output terminals of the first to the k-th output buffer circuits, comprising:

a bias circuit, generating a first bias voltage and a second bias voltage, wherein each of the first to the k-th output buffer circuits comprises:

a first conductivity type first transistor, receiving the received input signal by a gate and supplying a first power source voltage to a first node in response to an ON state according to the input signal;

a second conductivity type second transistor, receiving the received input signal by a gate and supplying a second power source voltage to a second node in response to the ON state according to the input signal;

a second conductivity type third transistor, receiving the first bias voltage by a gate, with a source connected to the second node and a drain connected to the first node;

a first conductivity type fourth transistor, receiving the second bias voltage by a gate, with a source connected to the first node and a drain connected to the second node;

a first conductivity type fifth transistor, receiving a voltage at the first node by a gate and supplying the first power source voltage to the output terminal in response to the ON state according to the voltage at the first node; and a second conductivity type sixth transistor, receiving a voltage at the second node by a gate and supplying the second power source voltage to the output terminal in response to the ON state according to the voltage at the second node.

* * * * *